(12) United States Patent
Miyazaki

(10) Patent No.: US 11,430,786 B2
(45) Date of Patent: Aug. 30, 2022

(54) SWITCH CIRCUIT, HIGH-FREQUENCY MODULE, AND COMMUNICATION APPARATUS

(71) Applicant: Murata Manufacturing Co., Ltd., Kyoto (JP)

(72) Inventor: Yuuta Miyazaki, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 321 days.

(21) Appl. No.: 16/817,740

(22) Filed: Mar. 13, 2020

(65) Prior Publication Data

US 2020/0294996 A1 Sep. 17, 2020

(30) Foreign Application Priority Data

Mar. 15, 2019 (JP) .............................. JP2019-048879

(51) Int. Cl.
*H01L 27/088* (2006.01)
*H03K 17/693* (2006.01)
*H03K 17/687* (2006.01)

(52) U.S. Cl.
CPC ....... *H01L 27/088* (2013.01); *H03K 17/6871* (2013.01); *H03K 17/693* (2013.01)

(58) Field of Classification Search
CPC . H03K 17/6871; H03K 17/693; H01L 27/088
USPC ....................................................... 257/368
See application file for complete search history.

(56) References Cited

U.S. PATENT DOCUMENTS

| 4,810,911 A * | 3/1989 | Noguchi | H03K 17/693 |
| | | | 327/431 |
| 5,680,079 A * | 10/1997 | Inami | H01P 1/185 |
| | | | 333/164 |
| 7,253,513 B2 * | 8/2007 | Miyazawa | H01L 23/552 |
| | | | 257/E23.079 |
| 2006/0118884 A1 | 6/2006 | Losehand et al. | |
| 2006/0286942 A1 * | 12/2006 | Okuyama | H01P 1/2135 |
| | | | 455/78 |
| 2012/0139616 A1 * | 6/2012 | Chiu | H03K 17/693 |
| | | | 327/436 |

FOREIGN PATENT DOCUMENTS

JP 2004-048411 A 2/2004
JP 2006-165524 A 6/2006

* cited by examiner

*Primary Examiner* — Metasebia T Retebo
(74) *Attorney, Agent, or Firm* — Pearne & Gordon LLP

(57) ABSTRACT

A switch circuit provided on a substrate includes a first series switch and a second series switch disposed in series on a path connecting a first terminal and a second terminal, a third series switch and a fourth series switch disposed in series on a path connecting the first terminal and a third terminal, a first shunt switch connected to a common ground terminal and a first node between the first series switch and the second series switch, and a second shunt switch connected to the common ground terminal and a second node between the third series switch and the fourth series switch.

11 Claims, 9 Drawing Sheets

SWITCH CIRCUIT, HIGH-FREQUENCY MODULE, AND COMMUNICATION APPARATUS

This application claims priority from Japanese Patent Application No. 2019-048879 filed on Mar. 15, 2019. The content of this application is incorporated herein by reference in its entirety.

BACKGROUND

The present disclosure relates to a switch circuit and a high-frequency module and a communication apparatus including the switch circuit.

In a mobile communication device such as a mobile phone, a switch circuit for switching a plurality of high-frequency filters has been employed as a result of the multiband development.

Japanese Unexamined Patent Application Publication No. 2006-165524 discloses a high-frequency power switch for switching between four terminals (RF1-RF4). The high-frequency power switch is a double-pole double-throw (DPDT) switch that allows conduction between the terminal RF1 and one of the terminal RF2 and the terminal RF4 and simultaneously allows conduction between the terminal RF3 and the other of the terminal RF2 and the terminal RF4.

However, in the DPDT switch described in Japanese Unexamined Patent Application Publication No. 2006-165524, a signal may flow to a parallel connection type switch (hereinafter referred to as shunt switch) connected to a ground potential without necessarily passing through a series connection type switch (hereinafter referred to as series switch) depending on the direction of a signal flowing between terminals. For example, in a case where a signal is input from the terminal RF1, a signal flows to the shunt switch without necessarily passing through the series switch. In this case, a large current flows through the ground terminal via the shunt switch, and the ground potential may fluctuate. Therefore, when the ground terminal to which two shunt switches are connected is made common in order to miniaturize the switch circuit, isolation characteristics of the switch circuit are deteriorated due to the fluctuation in the ground potential.

BRIEF SUMMARY

The present disclosure provides a switch circuit and the like that can reduce the size of a switch circuit by using in common a ground terminal connected to a plurality of shunt switches and can suppress deterioration in isolation characteristics due to a fluctuation in a ground potential.

A switch circuit according to embodiment of the present disclosure includes a first terminal, a second terminal, a third terminal, and a common ground terminal, a first switch and a second switch in series in a first path connecting the first terminal and the second terminal, a third switch and a fourth switch in series in a second path connecting the first terminal and the third terminal, a fifth switch connected to the common ground terminal and to a first node between the first switch and the second switch, and a sixth switch connected to the common ground terminal and to a second node between the third switch and the fourth switch.

Other features, elements, characteristics and advantages of the present disclosure will become more apparent from the following detailed description of embodiments of the present disclosure with reference to the attached drawings.

DETAILED DESCRIPTION

Figure 1:
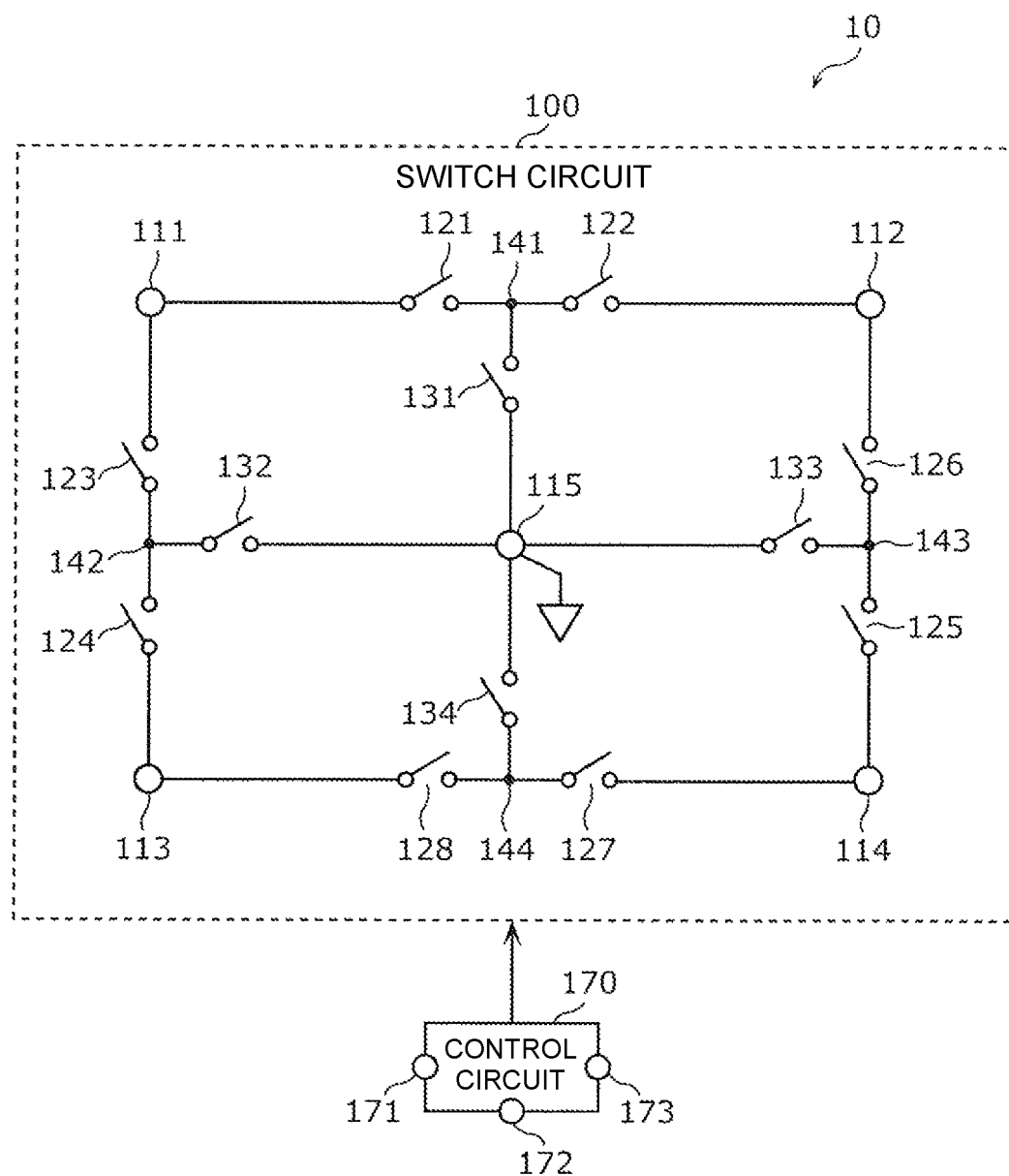
FIG. 1 is a circuit configuration diagram of a switch module according to a first embodiment.

Hereinafter, embodiments and a modification thereof of the present disclosure will be described in detail with reference to the accompanying drawings. It should be noted that the embodiments and the modification thereof described below are intended to be inclusive or specific examples. The numerical values, the shapes, the materials, the constituent elements, and the arrangement and the connection form of the constituent elements shown in the following embodiments and the modification thereof are merely examples, and are not intended to limit the present disclosure. Among the constituent elements in the following embodiments and the modification thereof, constituent elements not described in the independent claims will be described as arbitrary constituent elements.

Note that each of the figures is a schematic diagram in which emphasis, omission or adjustment of a ratio is performed to show the present disclosure, and is not necessarily strictly illustrated, and may differ from an actual shape, a positional relationship, and a ratio. In the figures, the same reference numerals are given to substantially the same components, and the repeated description may be omitted or simplified.

In the following figures, an X-axis and a Y-axis are axes orthogonal to each other on a plane parallel to a principal surface of a substrate and correspond to a first axis and a second axis, respectively. A Z-axis is an axis perpendicular to the principal surface of a module substrate.

In the present disclosure, the term "connected" includes not only a case of being directly connected by a connection terminal and/or a wiring conductor but also a case of being electrically connected via another circuit element.

In the present disclosure, the terms indicating relationships between elements such as parallel, vertical, and the like, the terms indicating shapes of elements such as rectangle and the like, and numerical ranges are meant to include not only strict meanings but also a substantially equal range, for example, a difference of approximately several percent.

In the present disclosure, "plan view" means that an object is projected onto an XY plane from a direction parallel to the Z-axis.

First Embodiment

A first embodiment will be described with reference to FIG. 1 to FIG. 5B.

1.1 Circuit Configuration of Switch Module 10

First, a circuit configuration of a switch module 10 according to the present embodiment will be described with reference to FIG. 1. FIG. 1 is a circuit configuration diagram of the switch module 10 according to the first embodiment. The switch module 10 includes a switch circuit 100 and a control circuit 170.

The switch circuit 100 is a so-called DPDT switch, and is provided on a substrate. That is, the switch circuit 100 switches between conduction and non-conduction between four terminals. The detailed circuit configuration of the switch circuit 100 will be described later. Note that the switch circuit 100 may not be provided on the substrate.

The control circuit 170 is provided on, for example, the same substrate as the switch circuit 100, and controls the operation of the switch circuit 100. Specifically, the control circuit 170 includes, for example, a communication unit with the outside, a decoder, a power supply unit, a voltage conversion unit such as a charge pump that generates a negative voltage, a level converter, and the like. For communication with the outside, for example, serial communication, parallel communication, or the like can be used.

The control circuit 170 includes a power supply terminal 171, a ground terminal 172, and a control terminal 173. Drive power is input to the power supply terminal 171. The ground terminal 172 is a ground terminal for the control circuit 170. A control signal of the switch circuit 100 is input to the control terminal 173.

The control circuit 170 can be included as a component of the switch module according to the present disclosure.

1.2 Circuit Configuration of Switch Circuit 100

Here, a circuit configuration of the switch circuit 100 will be described specifically with reference to FIG. 1.

As illustrated in FIG. 1, the switch circuit 100 includes first to fourth terminals 111 to 114, a common ground terminal 115, first to eighth series switches 121 to 128, and first to fourth shunt switches 131 to 134. The switch circuit 100 switches between the conduction and non-conduction between the first terminal 111 and the second terminal 112, between the first terminal 111 and the third terminal 113, between the second terminal 112 and the fourth terminal 114, and between the third terminal 113 and the fourth terminal 114.

The first series switch 121 and the second series switch 122 are examples of a first switch and a second switch, respectively, and are disposed in series on a first path connecting the first terminal 111 and the second terminal 112. The first series switch 121 switches between conduction and non-conduction between the first terminal 111 and a first node 141. The second series switch 122 switches between conduction and non-conduction between the second terminal 112 and the first node 141. The first node 141 is a node between the first series switch 121 and the second series switch 122.

The third series switch 123 and the fourth series switch 124 are examples of a third switch and a fourth switch, respectively, and are disposed in series on a second path connecting the first terminal 111 and the third terminal 113. The third series switch 123 switches between conduction and non-conduction between the first terminal 111 and a second node 142. The fourth series switch 124 switches between conduction and non-conduction between the third terminal 113 and the second node 142. The second node 142 is a node between the third series switch 123 and the fourth series switch 124.

The fifth series switch 125 and the sixth series switch 126 are examples of a seventh switch and an eighth switch, respectively, and are disposed in series on a third path connecting the fourth terminal 114 and the second terminal 112. The fifth series switch 125 switches between conduction and non-conduction between the fourth terminal 114 and a third node 143. The sixth series switch 126 switches between conduction and non-conduction between the second terminal 112 and the third node 143. The third node 143 is a node between the fifth series switch 125 and the sixth series switch 126.

The seventh series switch 127 and the eighth series switch 128 are examples of a ninth switch and a tenth switch, respectively, and are disposed in series on a fourth path connecting the fourth terminal 114 and the third terminal 113. The seventh series switch 127 switches between conduction and non-conduction between the fourth terminal 114 and the fourth node 144. The eighth series switch 128 switches between conduction and non-conduction between the third terminal 113 and the fourth node 144. The fourth node 144 is a node between the seventh series switch 127 and the eighth series switch 128.

Each of the first to eighth series switches 121 to 128 may be configured by a plurality of MOS-FETs connected in series. Thus, it is possible to withstand a higher voltage in each of the series switches. For example, eight stages may be used as the number of stages of the series connection of the MOS-FET, but the present disclosure is not limited thereto. For example, any number of one or more stages may be used in accordance with the required withstand voltage. In general, any number of stages from five stages to 15 stages is often used.

Note that the configuration of the first to eighth series switches 121 to 128 is not limited thereto, and other transistors such as a bipolar transistor may be used instead of the MOS-FET. In addition, capacitors may be disposed in parallel between a drain and a source of each FET in order to equalize voltages applied to each FET.

The first shunt switch 131 is an example of a fifth switch, and is connected to the first node 141 and the common ground terminal 115. The first shunt switch 131 switches between conduction and non-conduction between the first node 141 and the common ground terminal 115.

The second shunt switch 132 is an example of a sixth switch, and is connected to the second node 142 and the common ground terminal 115. The second shunt switch 132 switches between conduction and non-conduction between the second node 142 and the common ground terminal 115.

The third shunt switch 133 is an example of an eleventh switch, and is connected to the third node 143 and the common ground terminal 115. The third shunt switch 133 switches between conduction and non-conduction between the third node 143 and the common ground terminal 115.

The fourth shunt switch 134 is an example of a twelfth switch, and is connected to the fourth node 144 and the common ground terminal 115. The fourth shunt switch 134 switches between conduction and non-conduction between the fourth node 144 and the common ground terminal 115.

Each of the first to fourth shunt switches 131 to 134 may be configured by a plurality of MOS-FETs connected in series. For example, eight stages may be used as the number of stages of the series connection of the MOS-FET, but the present disclosure is not limited thereto. For example, any number of one or more stages may be used in accordance with the required withstand voltage. In general, any number of stages from five stages to 15 stages is often used. Note that the configuration of the first to fourth shunt switches 131 to 134 is not limited thereto, and other transistors may be used instead of the MOS-FET.

1.3 Arrangement of Circuit Elements in Switch Module 10

Figure 2:
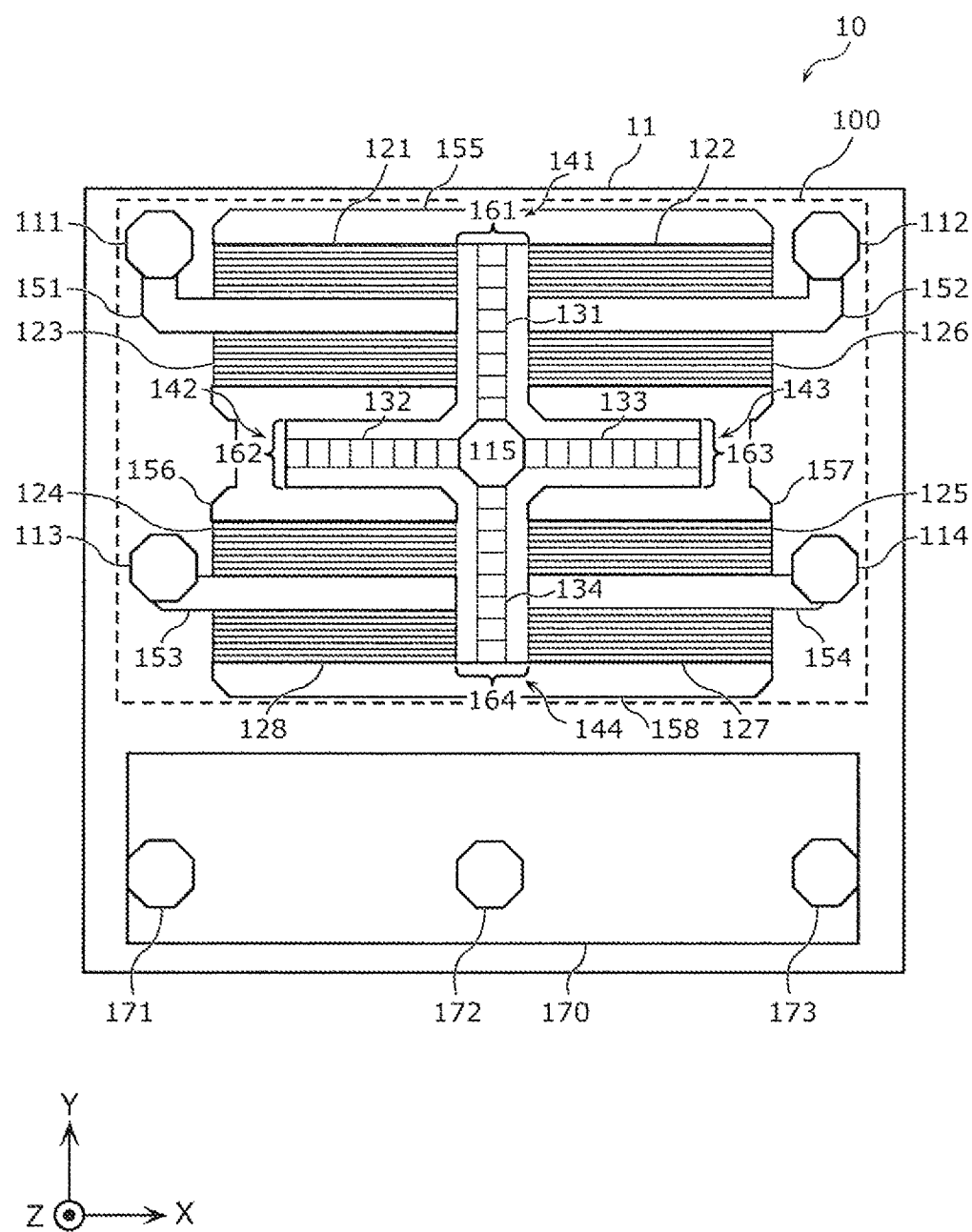
FIG. 2 is a plan view of the switch module according to the first embodiment.

Next, the arrangement of the circuit elements configuring the switch module 10 will be described specifically with reference to FIG. 2. FIG. 2 is a plan view of the switch module 10 according to the first embodiment. In FIG. 2, the circuit elements in the control circuit 170 are omitted.

In addition to the switch circuit 100 and the control circuit 170, the switch module 10 further includes a substrate 11 having a substantially rectangular shape in a plan view. The switch circuit 100 and the control circuit 170 illustrated in FIG. 1 are mounted on the substrate 11. The shape of the substrate 11 is an example, and is not limited to the substantially rectangular shape.

As the substrate 11, a semiconductor substrate can be used. As the semiconductor substrate, a silicon on insulator (SOI) semiconductor substrate in which a trap rich layer, an insulating layer called a BOX layer, and a silicon layer for function are laminated on a high resistance silicon substrate can be used. Further, depending on use frequency bands and performance requirements, a normal silicon substrate, which is also referred to as a bulk CMOS, may be used as the semiconductor substrate. In addition, a gallium arsenide substrate may also be used as the semiconductor substrate. Further, as the substrate 11, a printed circuit board (PCB), a low temperature co-fired ceramic (LTCC) substrate, a resin multilayer substrate, or the like may be used. Note that the substrate 11 is not limited to the substrates described above.

The switch circuit 100 further includes first to eighth electrodes 151 to 158 in addition to the circuit elements and the terminals illustrated in FIG. 1.

The first electrode 151 is a wiring for connecting the first terminal 111, the first series switch 121, and the third series switch 123. The second electrode 152 is a wiring for connecting the second terminal 112, the second series switch 122, and the sixth series switch 126. The third electrode 153 is a wiring for connecting the third terminal 113, the fourth series switch 124, and the eighth series switch 128. The fourth electrode 154 is a wiring for connecting the fourth terminal 114, the fifth series switch 125, and the seventh series switch 127.

The fifth electrode 155 is a wiring for connecting the first series switch 121, the second series switch 122, and the first shunt switch 131. The sixth electrode 156 is a wiring for connecting the third series switch 123, the fourth series switch 124, and the second shunt switch 132. The seventh electrode 157 is a wiring for connecting the fifth series switch 125, the sixth series switch 126, and the third shunt switch 133. The eighth electrode 158 is a wiring for connecting the seventh series switch 127, the eighth series switch 128, and the fourth shunt switch 134.

The shape and arrangement of the circuit elements and the like on the substrate 11 in a plan view will be described below.

The first to fourth terminals 111 to 114 are disposed at positions of four vertices of the rectangle on the substrate 11. More specifically, the first terminal 111, the second terminal 112, the fourth terminal 114, and the third terminal 113 are disposed at the positions of the four vertices of the substantially rectangular shape in this order clockwise with the first terminal 111 as an upper left vertex. Further, the common ground terminal 115 is disposed within the substantially rectangular region on the substrate 11. This substantially rectangular shape is a virtual shape represented by connecting four terminals virtually in a straight line, and is not a shape of an actual structure on the substrate 11.

Each of the first to eighth series switches 121 to 128 is disposed so as to allow a signal to flow in a direction parallel to the Y-axis. Also, each of the first to eighth series switches 121 to 128 extends along the X-axis. The first to eighth series switches 121 to 128 have the same size and the same shape. Specifically, each of the first to eighth series switches 121 to 128 has a substantially rectangular shape having a long side parallel to the X-axis.

The first to eighth series switches 121 to 128 are arranged in a matrix form at distances. In FIG. 2, the first to eighth series switches 121 to 128 are arranged in four rows and two columns. Specifically, the first series switch 121, the third series switch 123, the fourth series switch 124, and the eighth series switch 128 are arranged in a row along the Y-axis. Further, the second series switch 122, the fifth series switch 125, the sixth series switch 126, and the seventh series switch 127 are arranged in a row along the Y-axis.

Note that "arranged in a row" in this specification is not limited to a case where sides configuring an outer circumference of each element arranged in a row are on the same straight line when the substrate is viewed in a plan view. That is, "arranged in a row" is not limited to a case where positions of the plurality of elements in a direction perpendicular to the column coincide with each other strictly, and means that it includes a range that can be regarded as substantially matching, for example, a deviation of several percent. For example, the position of the side (for example, the left side) parallel to the Y-axis configuring the outer circumference of the first series switch 121 may be shifted in an X direction from the position of the side (for example, the left side) parallel to the Y-axis configuring the outer circumference of the third series switch 123, for example may be shifted by about several μm. The same applies to the other switches.

The first to fourth shunt switches 131 to 134 have a substantially rectangular shape extending along the X-axis or Y-axis. The first to fourth shunt switches 131 to 134 have the same size and the same shape.

The first shunt switch 131 is disposed in a region between the first series switch 121 and the second series switch 122. Further, the first shunt switch 131 is disposed between the third series switch 123 and the sixth series switch 126. Specifically, the first shunt switch 131 is disposed over a region between the first series switch 121 and the second series switch 122 and a region between the third series switch 123 and the sixth series switch 126.

In FIG. 2, the first shunt switch 131 is disposed in a first region 161 and extends from the common ground terminal 115 to the fifth electrode 155 in a positive direction of the Y-axis. The first region 161 is a region between a column of the first series switch 121, the first electrode 151, and the third series switch 123 aligned along the Y-axis and a column of the second series switch 122, the second electrode 152, and the sixth series switch 126 aligned along the Y-axis. The first shunt switch 131 is disposed with a gap with each of the column of the first series switch 121, the first electrode 151, and the third series switch 123, and the column of the second series switch 122, the second electrode 152, and the sixth series switch 126.

The second shunt switch 132 is disposed in a region between the third series switch 123 and the fourth series switch 124. Further, the second shunt switch 132 is disposed between the first series switch 121 and the eighth series switch 128. In FIG. 2, the second shunt switch 132 is disposed in a second region 162 and extends from the common ground terminal 115 to the sixth electrode 156 in a negative direction of the X-axis. The second region 162 is an inner region of the substantially U-shaped sixth electrode 156 that connects the third series switch 123 and the fourth series switch 124. The second shunt switch 132 is disposed with gaps from side portions of the sixth electrode 156 extending along the X-axis.

The third shunt switch 133 is disposed in a region between the fifth series switch 125 and the sixth series switch 126. Further, the third shunt switch 133 is disposed between the second series switch 122 and the seventh series switch 127. In FIG. 2, the third shunt switch 133 is disposed in a third region 163 and extends from the common ground terminal 115 to the seventh electrode 157 in a positive direction of the X-axis. The third region 163 is an inner region of the substantially U-shaped seventh electrode 157 that connects the fifth series switch 125 and the sixth series switch 126. The third shunt switch 133 is disposed with gaps from side portions of the seventh electrode 157 extending along the X-axis.

The fourth shunt switch 134 is disposed in a region between the seventh series switch 127 and the eighth series switch 128. Further, the fourth shunt switch 134 is disposed between the fourth series switch 124 and the fifth series switch 125. Specifically, the fourth shunt switch 134 is disposed over a region between the seventh series switch 127 and the eighth series switch 128 and a region between the fourth series switch 124 and the fifth series switch 125.

In FIG. 2, the fourth shunt switch 134 is disposed in a fourth region 164 and extends from the common ground terminal 115 to the eighth electrode 158 in a negative direction of the Y-axis. The fourth region 164 is a region between a column of the fourth series switch 124, the third electrode 153, and the eighth series switch 128 aligned along the Y-axis and a column of the fifth series switch 125, the fourth electrode 154, and the seventh series switch 127 aligned along the Y-axis. The fourth shunt switch 134 is disposed with a gap with each of the column of the fourth series switch 124, the third electrode 153, and the eighth series switch 128, and the column of the fifth series switch 125, the fourth electrode 154, and the seventh series switch 127.

The first to fourth shunt switches 131 to 134 disposed in this manner form a substantially cross shape around the common ground terminal 115. That is, the first shunt switch 131 and the fourth shunt switch 134 extend in opposite directions from each other from the common ground terminal 115 along the Y-axis. Further, the second shunt switch 132 and the third shunt switch 133 extend in opposite directions from each other from the common ground terminal 115 along the X-axis.

The eight series switches and the four shunt switches are disposed point-symmetrically with respect to the common ground terminal 115 as a symmetrical point. Specifically, in a pair of the first series switch 121 and the seventh series switch 127, a pair of the second series switch 122 and the eighth series switch 128, a pair of the third series switch 123 and the fifth series switch 125, a pair of the fourth series switch 124 and the sixth series switch 126, a pair of the first shunt switch 131 and the fourth shunt switch 134, and a pair of the second shunt switch 132 and the third shunt switch 133, the two switches are disposed point-symmetrically with respect to the common ground terminal 115 as a symmetrical point.

The first electrode 151 extends along the X-axis in a region between the first series switch 121 and the third series switch 123, and has two opposite long side portions extending along the X-axis. The first electrode 151 is joined to a long side portion of the first series switch 121 and a long side portion of the third series switch 123 at the two long side portions opposed to each other.

The second electrode 152 extends along the X-axis in a region between the second series switch 122 and the sixth series switch 126, and has two opposite long side portions extending along the X-axis. The second electrode 152 is joined to a long side portion of the second series switch 122 and a long side portion of the sixth series switch 126 at the two long side portions opposed to each other.

The third electrode 153 extends along the X-axis in a region between the fourth series switch 124 and the eighth series switch 128, and has two opposite long side portions extending along the X-axis. The third electrode 153 is joined to a long side portion of the fourth series switch 124 and a long side portion of the eighth series switch 128 at the two long side portions opposed to each other.

The fourth electrode 154 extends along the X-axis in a region between the fifth series switch 125 and the seventh series switch 127, and has two opposite long side portions extending along the X-axis. The fourth electrode 154 is joined to a long side portion of the fifth series switch 125 and a long side portion of the seventh series switch 127 at the two long side portions opposed to each other.

The fifth electrode 155 extends along the X-axis in a region between the first terminal 111 and the second terminal 112. The fifth electrode 155 has a long side portion extending along the X-axis and, along the long side portion, is joined to the long side portion of the first series switch 121 and the long side portion of the second series switch 122. The fifth electrode 155 is joined to a distal end portion of the first shunt switch 131 (an end portion on the side opposite to an end portion on the common ground terminal 115 side of the first shunt switch 131) in an intermediate portion in a longitudinal direction corresponding to the first node 141.

The sixth electrode 156 is disposed in a region between the third series switch 123 and the fourth series switch 124, and has a substantially U-like shape that opens toward the common ground terminal 115. The sixth electrode 156 is joined to the long side portion of the third series switch 123 and the long side portion of the fourth series switch 124 at outer edges of two arms of the substantially U-like shape. Further, the sixth electrode 156 is joined to a distal end portion of the second shunt switch 132 (an end portion on the side opposite to an end portion on the common ground terminal 115 side of the second shunt switch 132) in an inner edge of a substantially U-shaped bottom portion corresponding to the second node 142.

The seventh electrode 157 is disposed in a region between the fifth series switch 125 and the sixth series switch 126, and has a substantially U-like shape that opens toward the common ground terminal 115. The seventh electrode 157 is joined to the long side portion of the fifth series switch 125 and the long side portion of the sixth series switch 126 at outer edges of two arms of substantially U-like shape. Further, the seventh electrode 157 is joined to a distal end portion of the third shunt switch 133 (an end portion on the side opposite to an end portion on the common ground terminal 115 side of the third shunt switch 133) in an inner edge of a substantially U-shaped bottom portion corresponding to the third node 143.

The eighth electrode 158 has a substantially elongated shape extending along the X-axis. The eighth electrode 158 is joined to the long side portion of the seventh series switch 127 and the long side portion of the eighth series switch 128 along the long side portion having the substantially elongated shape. In addition, the eighth electrode 158 is joined to a distal end portion of the fourth shunt switch 134 (an end portion on the side opposite to an end portion on the common ground terminal 115 side of the fourth shunt switch 134) in an intermediate portion in a longitudinal direction corresponding to the fourth node 144.

The power supply terminal 171, the ground terminal 172, and the control terminal 173 of the control circuit 170 are arranged in a row along the X-axis. The power supply terminal 171 is arranged with the first terminal 111 and the third terminal 113 in a row along the Y-axis. The ground terminal 172 is arranged with the common ground terminal 115 in a row along the Y-axis. The control terminal 173 is arranged with the second terminal 112 and the fourth terminal 114 in a row along the Y-axis.

Note that the control circuit 170 may not be mounted on the same substrate as the switch circuit 100. That is, the control circuit 170 may be mounted on a substrate different from that of the switch circuit 100. In this case, the switch circuit 100 may further include a control terminal for inputting a control signal from the control circuit 170.

1.4 Operating State of Switch Circuit 100

Figure 3A:
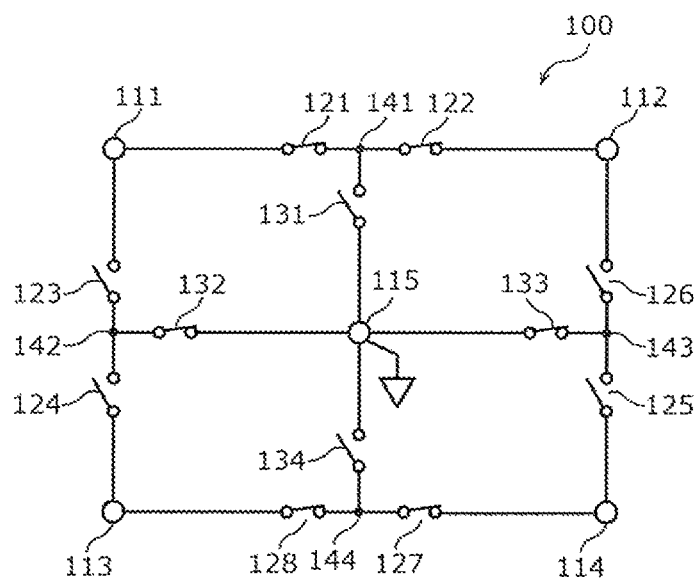
FIG. 3A is a circuit diagram of a switch circuit in a first operating state according to the first embodiment.
Figure 3B:
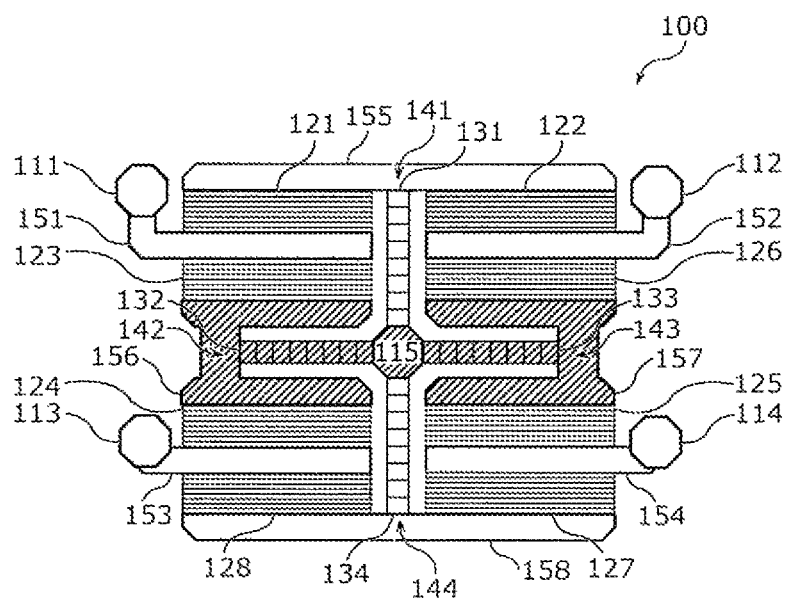
FIG. 3B is a plan view of the switch circuit in the first operating state in the first embodiment.
Figure 4A:
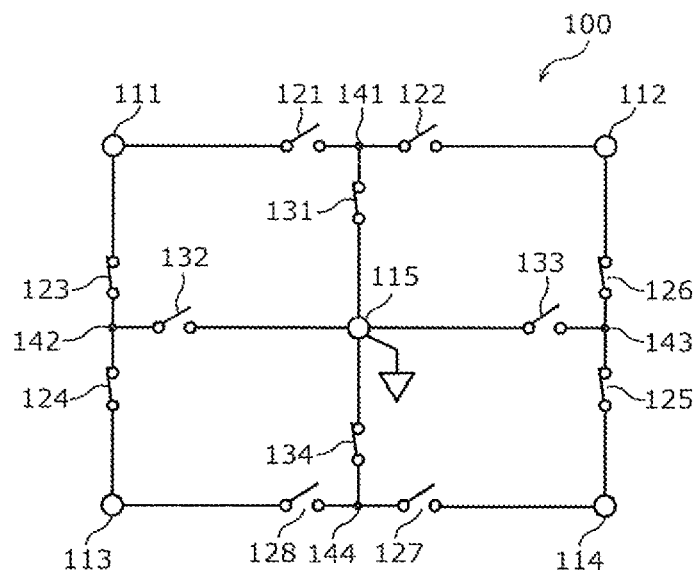
FIG. 4A is a circuit diagram of the switch circuit in a second operating state according to the first embodiment.
Figure 4B:
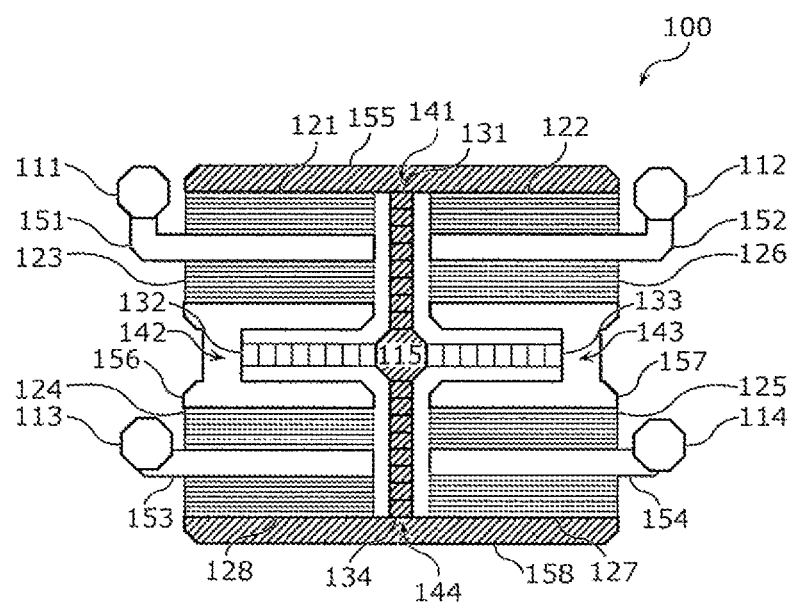
FIG. 4B is a plan view of the switch circuit in the second operating state in the first embodiment.

Next, the operating state of the switch circuit 100 configured as described above will be described specifically with reference to FIG. 3A to FIG. 4B. FIG. 3A and FIG. 3B are a circuit diagram and a plan view of the switch circuit 100 in a first operating state according to the first embodiment. FIG. 4A and FIG. 4B are a circuit diagram and a plan view of the switch circuit 100 in a second operating state according to the first embodiment. Note that in FIG. 3B and FIG. 4B, hatched portions represent a portion that is set to a ground potential.

First, the first operating state will be described.

As illustrated in FIG. 3A, in the first operating state, the first series switch 121, the second series switch 122, the seventh series switch 127, the eighth series switch 128, the second shunt switch 132, and the third shunt switch 133 are turned on. Conversely, the third series switch 123, the fourth series switch 124, the fifth series switch 125, the sixth series switch 126, the first shunt switch 131, and the fourth shunt switch 134 are turned off.

Thus, the first terminal 111 and the second terminal 112 are connected to each other, and the third terminal 113 and the fourth terminal 114 are connected to each other. Conversely, the first terminal 111 and the third terminal 113 are separated from each other, and the second terminal 112 and the fourth terminal 114 are separated from each other.

That is, when a high-frequency signal is input from the first terminal 111, the high-frequency signal is output from the second terminal 112 passing through the first electrode 151, the first series switch 121, the fifth electrode 155, the second series switch 122, and the second electrode 152 in this order. On the other hand, when a high-frequency signal is input from the second terminal 112, the high-frequency signal is output from the first terminal 111 passing in the reverse order.

Similarly, when a high-frequency signal is input from the third terminal 113, the high-frequency signal is output from the fourth terminal 114 passing through the third electrode 153, the eighth series switch 128, the eighth electrode 158, the seventh series switch 127, and the fourth electrode 154 in this order. On the other hand, when a high-frequency signal is input from the fourth terminal 114, the high-frequency signal is output from the third terminal 113 passing in the reverse order.

At this time, as illustrated in FIG. 3B, the sixth electrode 156 is connected to the common ground terminal 115 with the second shunt switch 132 interposed therebetween, and is set to a ground potential. The seventh electrode 157 is connected to the common ground terminal 115 with the third shunt switch 133 interposed therebetween, and is set to a ground potential.

Next, the second operating state will be described.

As illustrated in FIG. 4A, in the second operating state, the third series switch 123, the fourth series switch 124, the fifth series switch 125, the sixth series switch 126, the first shunt switch 131, and the fourth shunt switch 134 are turned on. Conversely, the first series switch 121, the second series switch 122, the seventh series switch 127, the eighth series switch 128, the second shunt switch 132, and the third shunt switch 133 are turned off.

Thus, the first terminal 111 and the third terminal 113 are connected to each other, and the second terminal 112 and the fourth terminal 114 are connected to each other. Conversely, the first terminal 111 and the second terminal 112 are separated from each other, and the third terminal 113 and the fourth terminal 114 are separated from each other.

That is, when a high-frequency signal is input from the first terminal 111, the high-frequency signal is output from the third terminal 113 passing through the first electrode 151, the third series switch 123, the sixth electrode 156, the fourth series switch 124, and the third electrode 153. On the other hand, when a high-frequency signal is input from the third terminal 113, the high-frequency signal is output from the first terminal 111 passing in the reverse order.

Similarly, when a high-frequency signal is input from the second terminal 112, the high-frequency signal is output from the fourth electrode passing through the second electrode 152, the sixth series switch 126, the seventh electrode 157, the fifth series switch 125, and the fourth electrode 154 in this order. On the other hand, when a high-frequency signal is input from the fourth terminal 114, the high-frequency signal is output from the second terminal 112 passing in the reverse order.

At this time, as illustrated in FIG. 4B, the fifth electrode 155 is connected to the common ground terminal 115 with the first shunt switch 131 interposed therebetween, and is set to a ground potential. The eighth electrode 158 is connected to the common ground terminal 115 with the fourth shunt switch 134 interposed therebetween, and is set to a ground potential.

The operating state of the switch circuit 100 is not limited to only the first operating state and the second operating state. The switch circuit 100 may have another operating state different from the first operating state and the second operating state.

1.5 Packaging of Switch Module 10

Figure 5A:
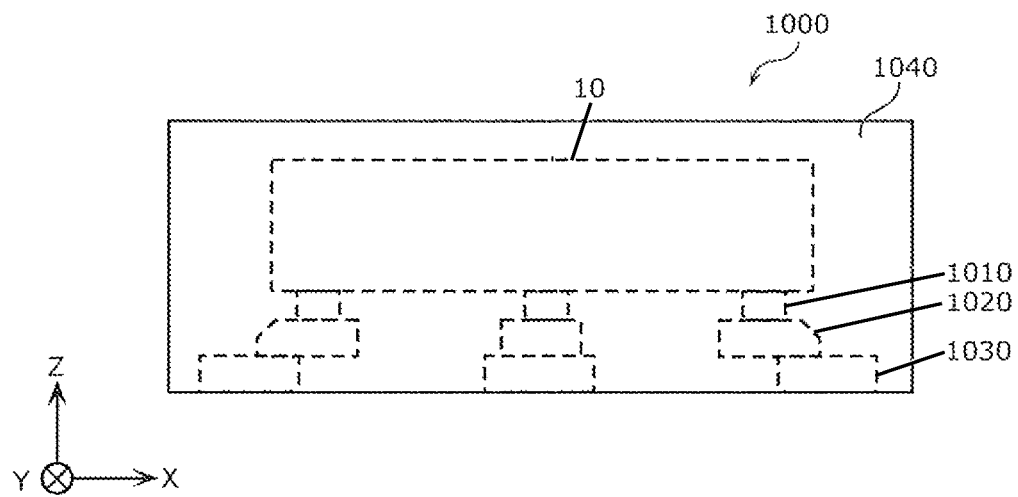
FIG. 5A is a front view of a semiconductor package of a switch module according to an embodiment.
Figure 5B:
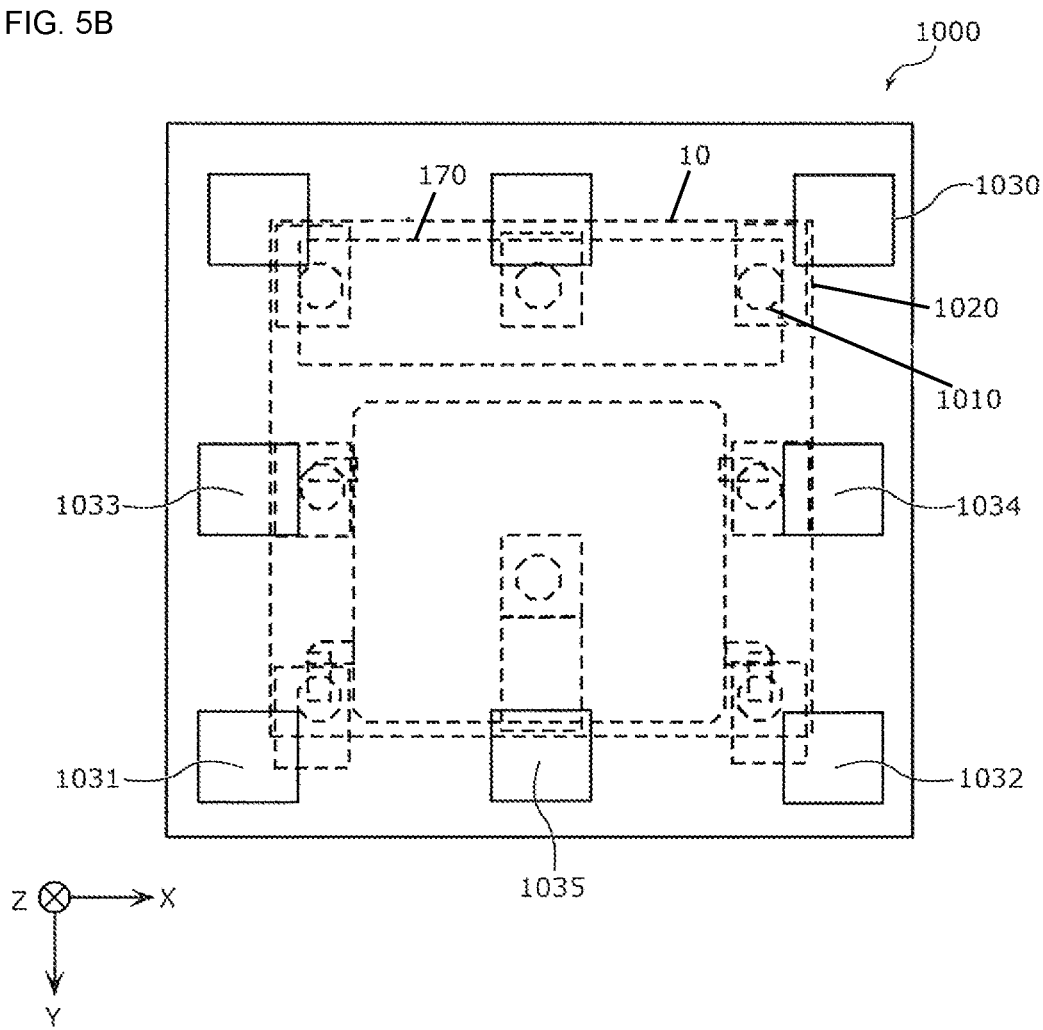
FIG. 5B is a bottom view of a semiconductor package of a switch module according to an embodiment.

Next, a semiconductor package 1000 of the switch module 10 will be described specifically with reference to FIG. 5A and FIG. 5B. As illustrated in FIG. 5A and FIG. 5B, the semiconductor package 1000 includes the switch module 10, a plurality of bump electrodes 1010, a plurality of bonding pads 1020, a plurality of lead frames 1030 including lead frames 1031 to 1035, and a sealing resin 1040.

Each of a plurality of lead frames 1030 can be processed by etching or pressing copper or an alloy containing copper as a main component, and then processed by a press bending process or the like.

The first to fourth terminals 111 to 114, the common ground terminal 115, the power supply terminal 171, the ground terminal 172, and the control terminal 173 of the switch module 10 are bonded to a plurality of bonding pads 1020 provided on the plurality of lead frames 1030 by a plurality of bump electrodes 1010.

The sealing resin 1040 is molded by transfer molding in which a mixture of a thermosetting resin (for example, an epoxy resin or the like) and a filler (for example, a glass fiber or the like) is injected into an envelope. As the sealing resin 1040, a thermoplastic resin may be used. In this case, an injection mold may be used.

Thus, each of the first to fourth terminals 111 to 114, the common ground terminal 115, the power supply terminal 171, the ground terminal 172, and the control terminal 173 is connected to one of the plurality of lead frames 1030. For example, the first to fourth terminals 111 to 114 are connected to the lead frames 1031 to 1034, respectively. Further, the common ground terminal 115 is connected to the lead frame 1035.

Note that the semiconductor package 1000 illustrated in FIG. 5A and FIG. 5B is an example of packaging of the switch module 10, and the packaging of the switch module 10 is not limited thereto. For example, a terminal of a printed circuit board may be provided instead of a lead frame. Further, when needed, a resin surface may be covered with one or more kinds of metal films such as titanium, copper, nickel, and the like. Then, a metal film may be set to a ground potential to provide a function of an electromagnetic shield. Alternatively, the substrate 11 may be used as a chip size package.

1.6 Effects of First Embodiment

As described above, the switch circuit 100 according to the present embodiment is the switch circuit 100 mounted on the substrate 11, and may include the first terminal 111, the second terminal 112, the third terminal 113, and the common ground terminal 115, the first series switch 121 and the second series switch 122 disposed in series on a path connecting the first terminal 111 and the second terminal 112, the third series switch 123 and the fourth series switch 124 disposed in series on a path connecting the first terminal 111 and the third terminal 113, the first shunt switch 131 connected to the common ground terminal 115 and the first node 141 between the first series switch 121 and the second series switch 122, and the second shunt switch 132 connected to the common ground terminal 115 and the second node 142 between the third series switch 123 and the fourth series switch 124. The switch circuit 100 may further include the fourth terminal 114, the fifth series switch 125 and the sixth series switch 126 disposed in series on a path connecting the fourth terminal 114 and the second terminal 112, the seventh series switch 127 and the eighth series switch 128 disposed in series on a path connecting the fourth terminal 114 and the third terminal 113, the third shunt switch 133 connected to the common ground terminal 115 and the third node 143 between the fifth series switch 125 and the sixth series switch 126, and the fourth shunt switch 134 connected to the common ground terminal 115 and the fourth node 144 between the seventh series switch 127 and the eighth series switch 128.

Thus, the first to fourth shunt switches 131 to 134 are connected to the one common ground terminal 115. Therefore, the number of terminals of the switch circuit 100 can be reduced, and reduction in the size of the switch circuit 100 can be achieved. Furthermore, each shunt switch is connected to the node between two series switches. Accordingly, it is possible to prevent a large current from flowing to the shunt switch without necessarily passing through the series switch, regardless of the direction of a signal flowing between the terminals. For example, even when a signal is input from either of the first terminal 111 and the second terminal 112, by turning off the first series switch 121 and the second series switch 122, current is interrupted or attenuated in either one of the first series switch 121 and the second series switch 122, so that it is possible to prevent a large current from flowing to the first shunt switch 131. As a result, the switch circuit 100 can stabilize the ground potential, and can suppress deterioration in isolation characteristics due to the fluctuation in the ground potential.

According to the switch circuit 100 of the present embodiment, in a plan view of the substrate 11, the first shunt switch 131 may be disposed in a region between the first series switch 121 and the second series switch 122, the second shunt switch 132 may be disposed in a region between the third series switch 123 and the fourth series switch 124, the third shunt switch 133 may be disposed in a region between the fifth series switch 125 and the sixth series switch 126, and the fourth shunt switch 134 may be disposed in a region between the seventh series switch 127 and the eighth series switch 128.

Thus, the shunt switch connected to the common ground terminal 115 can be disposed in the region between the two series switches disposed in series on the path connecting the two terminals. In the region between two series switches, a gap is often provided for isolation. Therefore, by disposing the shunt switch in the region between the two series switches, the gap can be effectively utilized, and the switch circuit 100 can be made smaller.

According to the switch circuit 100 of the present embodiment, in a plan view of the substrate 11, the first shunt switch 131 may be disposed in a region between the third series switch 123 and the sixth series switch 126, the second shunt switch 132 may be disposed in a region between the first series switch 121 and the eighth series switch 128, the third shunt switch 133 may be disposed in a region between the second series switch 122 and the seventh series switch 127, and the fourth shunt switch 134 may be disposed in a region between the seventh series switch 127 and the eighth series switch 128.

Thereby, by turning on two shunt switches connected to two non-conductive paths, the region set to the ground potential can be disposed between two conductive paths. Therefore, isolation characteristics between the two conductive paths can be improved. This will be described specifically with reference to FIG. 3A to FIG. 4B.

In the first operating state, as illustrated in FIG. 3A, the first terminal 111 and the second terminal 112 are connected to each other, and the third terminal 113 and the fourth terminal 114 are connected to each other. At this time, a region (hatched region in FIG. 3B) set to the ground potential can be disposed between the first terminal 111 and the second terminal 112, and the first electrode 151, the first series switch 121, the fifth electrode 155, the second series switch 122, and the second electrode 152 which are disposed on a path connecting the first terminal 111 and the second terminal 112 (hereinafter referred to as a first-second circuit), and the third terminal 113 and the fourth terminal 114, and the third electrode 153, the eighth series switch 128, the eighth electrode 158, the seventh series switch 127, and the fourth electrode 154 which are disposed on a path connecting the third terminal 113 and the fourth terminal 114 (hereinafter referred to as a third-fourth circuit). Therefore, an electric field generated in the first-second circuit can be suppressed from propagating to the third-fourth circuit. Similarly, an electric field generated in the third-fourth circuit can also be suppressed from propagating to the first-second circuit. As a result, the isolation characteristics between the first terminal 111 and the second terminal 112, and between the third terminal 113 and the fourth terminal 114 can be improved.

In the second operating state, as illustrated in FIG. 4A, the first terminal 111 and the third terminal 113 are connected to each other, and the second terminal 112 and the fourth terminal 114 are connected to each other. At this time, a region (hatched region in FIG. 4B) set to the ground potential can be disposed between the first terminal 111 and the third terminal 113, and the first electrode 151, the third series switch 123, the sixth electrode 156, the fourth series switch 124, and the third electrode 153 which are disposed on a path connecting the first terminal 111 and the third terminal 113 (hereinafter referred to as a first-third circuit), and the second terminal 112 and the fourth terminal 114, and the second electrode 152, the sixth series switch 126, the seventh electrode 157, the fifth series switch 125, and the fourth electrode 154 which are disposed on a path connecting the second terminal 112 and the fourth terminal 114 (hereinafter referred to as a second-fourth circuit). Therefore, an electric field generated in the first-third circuit can be suppressed from propagating to the second-fourth circuit. Similarly, an electric field generated in the second-fourth circuit can also be suppressed from propagating to the first-third circuit. As a result, the isolation characteristics between the first terminal 111 and the third terminal 113, and between the second terminal 112 and the fourth terminal 114 can be improved.

According to the switch circuit 100 of the present embodiment, the first terminal 111, the second terminal 112, the third terminal 113, and the fourth terminal 114 are disposed at positions of four vertices of a substantially rectangular shape, and the common ground terminal 115 is disposed within the substantially rectangular region, and in a plan view of the substrate 11, the first shunt switch 131 and the fourth shunt switch 134 can extend in opposite directions from each other from the common ground terminal 115 along the Y-axis direction, and the second shunt switch 132 and the third shunt switch 133 can extend in opposite directions from each other from the common ground terminal 115 along the X-axis direction.

Thus, the first to fourth shunt switches 131 to 134 can be disposed in a cross shape around the common ground terminal 115 disposed in the rectangular region having the four terminals as vertices. Therefore, the first to fourth nodes 141 to 144 connected to the first to fourth shunt switches 131 to 134 can be disposed symmetrically in four directions away from the common ground terminal 115. As a result, the series switches and electrodes connected to four terminals can be symmetrically disposed, and the symmetry of electrical characteristics between the terminals can be improved. Further, since the first to fourth shunt switches 131 to 134 extend along the X-axis or Y-axis, two series switches can be spaced apart along the X-axis or Y-axis direction to improve isolation characteristics.

Further, according to the switch circuit 100 of the present embodiment, in a plan view of the substrate 11, each of the first to eighth series switches 121 to 128 may be arranged to flow a signal in a direction parallel to the Y-axis, the first series switch 121, the third series switch 123, the fourth series switch 124, and the eighth series switch 128 may be arranged in a row along the Y-axis, and the second series switch 122, the fifth series switch 125, the sixth series switch 126, and the seventh series switch 127 may be arranged in a row along the Y-axis.

Thus, a plurality of series switches can be arranged in two rows along the Y-axis. Therefore, when a plurality of series switches has a substantially rectangular shape having the same size, a plurality of series switches can be arranged with a high density in a matrix form, and further miniaturization of the switch circuit 100 can be achieved.

Further, according to the switch circuit 100 of the present embodiment includes the first electrode 151 connecting the first terminal 111 to the first series switch 121 and the third series switch 123, the second electrode 152 connecting the second terminal 112 to the second series switch 122 and the sixth series switch 126, the third electrode 153 connecting the third terminal 113 to the fourth series switch 124 and the eighth series switch 128, and the fourth electrode 154 connecting the fourth terminal 114 to the fifth series switch 125 and the seventh series switch 127, and in a plan view of the substrate 11, each of the first to eighth series switches 121 to 128 extends along the X-axis, the first electrode 151 extends along the X-axis in a region between the first series switch 121 and the third series switch 123, the second electrode 152 extends along the X-axis in a region between the second series switch 122 and the sixth series switch 126, the third electrode 153 extends along the X-axis in a region between the fourth series switch 124 and the eighth series switch 128, and the fourth electrode 154 extends along the X-axis in a region between the fifth series switch 125 and the seventh series switch 127.

Thus, each of the first to eighth series switches 121 to 128 and the first to fourth electrodes 151 to 154 can be extended along the X-axis. Therefore, the series switch can be joined to the electrode along the X-axis, and a contact area between the series switch and the electrode can be increased. As a result, a resistance loss between the electrode and the series switch can be suppressed, and characteristics of the switch circuit 100 can be improved.

Modification of First Embodiment

Next, a modification of the first embodiment will be described. In this modification, the shape of the sixth electrode connected to the second shunt switch and the shape of the seventh electrode connected to the third shunt switch are mainly different from those of the first embodiment. Hereinafter, the present modification will be described specifically with reference to FIG. 6 mainly with respect to points different from those in the first embodiment.

Figure 6:
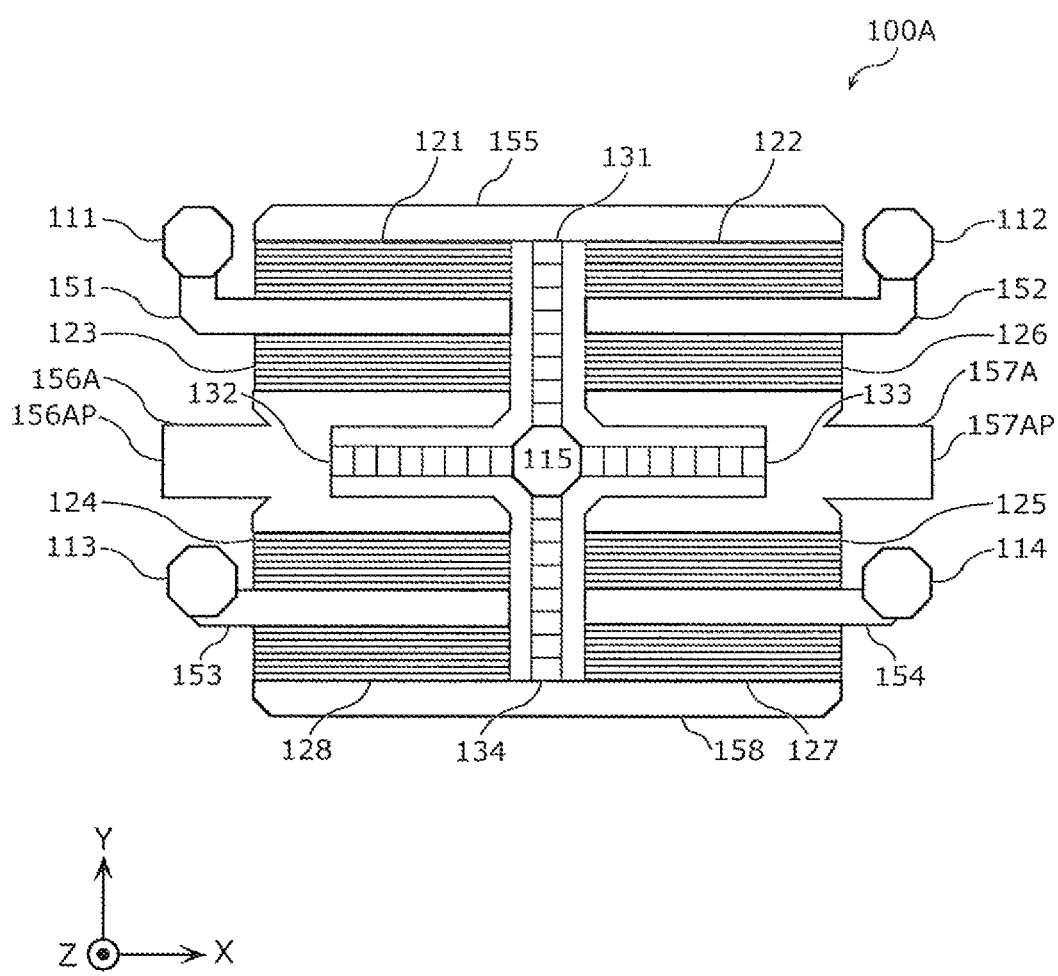
FIG. 6 is a plan view of a switch circuit according to a modification of the first embodiment.

FIG. 6 is a plan view of a switch circuit 100A according to the modification of the first embodiment. The switch circuit 100A according to the present modification includes a sixth electrode 156A and a seventh electrode 157A instead of the sixth electrode 156 and the seventh electrode 157 in the first embodiment.

Similarly to the sixth electrode 156 in the first embodiment, the sixth electrode 156A is a wiring for connecting the third series switch 123, the fourth series switch 124, and the second shunt switch 132. In the present modification, the sixth electrode 156A includes a protruding portion 156AP that protrudes in a negative direction of the X-axis direction perpendicular to a line connecting the first terminal 111 and the third terminal 113. The protruding portion 156AP is disposed on the line connecting the first terminal 111 and the third terminal 113. Here, as a line connecting two terminals, a line connecting the centers of two terminals may be used.

Similarly to the seventh electrode 157 in the first embodiment, the seventh electrode 157A is a wiring for connecting the fifth series switch 125, the sixth series switch 126, and the third shunt switch 133. In the present modification, the seventh electrode 157A includes a protruding portion 157AP that protrudes in a positive direction of the X-axis perpendicular to a line connecting the second terminal 112 and the fourth terminal 114. The protruding portion 157AP is disposed on the line connecting the second terminal 112 and the fourth terminal 114.

Note that the shapes of the sixth electrode 156A and the seventh electrode 157A are not limited to those illustrated in FIG. 6. When at least one of the shunt switch and the electrode connected to the shunt switch is disposed on a line connecting two terminals adjacent to each other, the shape of the electrode may be any shape.

As described above, the switch circuit 100A according to the present modification includes the fifth electrode 155 connecting the first series switch 121, the second series switch 122, and the first shunt switch 131, the sixth electrode 156A connecting the third series switch 123, the fourth series switch 124, and the second shunt switch 132, the seventh electrode 157A connecting the fifth series switch 125, the sixth series switch 126, and the third shunt switch 133, and the eighth electrode 158 connecting the seventh series switch 127, the eighth series switch 128, and the fourth shunt switch 134, and in a plan view of the substrate 11, at least one of the first shunt switch 131 and the fifth electrode 155 may be disposed on a line connecting the first terminal 111 and the second terminal 112, at least one of the second shunt switch 132 and the sixth electrode 156A may be disposed on a line connecting the first terminal 111 and the third terminal 113, at least one of the third shunt switch 133 and the seventh electrode 157A may be disposed on a line connecting the second terminal 112 and the fourth terminal 114, and at least one of the fourth shunt switch 134 and the eighth electrode 158 may be disposed on a line connecting the third terminal 113 and the fourth terminal 114.

Thus, at least one of the shunt switch and the electrode which are set to the ground potential when the shunt switch is turned on can be disposed on a line connecting two terminals adjacent to each other. Therefore, the isolation characteristics between the terminals can be further improved.

Second Embodiment

Next, a description will be given of a second embodiment. In the present embodiment, an arrangement of the series switches is mainly different from that of the first embodiment. Hereinafter, the present embodiment will be described specifically with reference to FIG. 7, focusing on points different from those of the first embodiment. Note that, since the circuit configuration and operating states of the switch circuit according to the present embodiment are the same as those in the first embodiment except that the first to eighth series switches 121 to 128 are replaced by first to eighth series switches 221 to 228, the illustration and description thereof are omitted.

2.1 Arrangement of Circuit Elements in Switch Circuit 200

Figure 7:
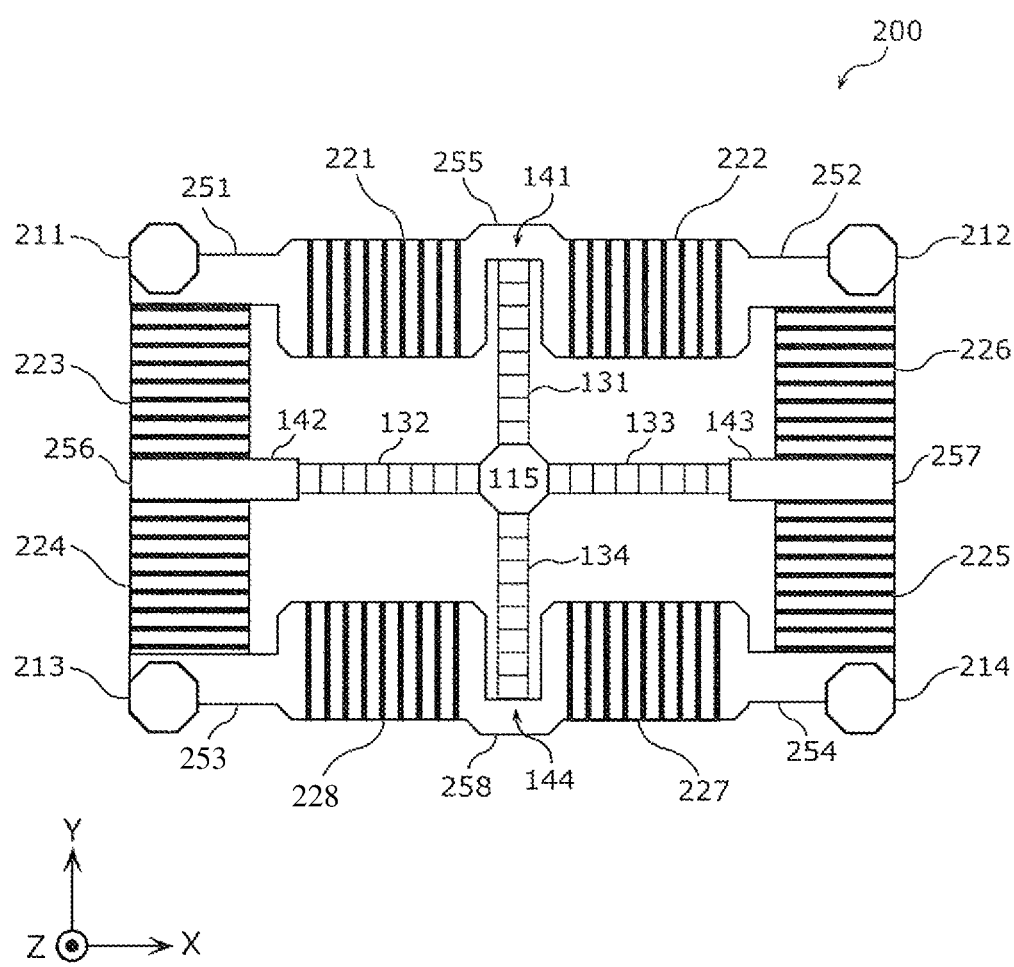
FIG. 7 is a plan view of a switch circuit according to a second embodiment.

FIG. 7 is a plan view of a switch circuit 200 according to the second embodiment. The switch circuit 200 according to the present embodiment includes first to fourth terminals 211 to 214, the common ground terminal 115, first to eighth series switches 221 to 228, first to fourth shunt switches 131 to 134, and first to eighth electrodes 251 to 258.

The first to fourth terminals 211 to 214 are disposed at positions of four vertices of a substantially rectangle. More specifically, the first terminal 211, the second terminal 212, the fourth terminal 214, and the third terminal 213 are disposed at the positions of the four vertices of the substantially rectangular shape in this order clockwise with the first terminal 211 as an upper left vertex. Further, the common ground terminal 115 is disposed at the center of the substantially rectangular region. That is, the first to fourth terminals 211 to 214 are disposed point-symmetrically with respect to the common ground terminal 115 as a symmetrical point.

The first to eighth series switches 221 to 228 have the same size and the same shape. Specifically, each of the first to eighth series switches 221 to 228 has a substantially rectangular shape.

Each of the first series switch 221, the second series switch 222, the seventh series switch 227, and the eighth series switch 228 is disposed so as to allow a signal to flow in a direction parallel to the X-axis. The first series switch 221 and the second series switch 222 are arranged along the X-axis between the first terminal 211 and the second terminal 212. The seventh series switch 227 and the eighth series switch 228 are arranged along the X-axis between the third terminal 213 and the fourth terminal 214.

Each of the third series switch 223, the fourth series switch 224, the fifth series switch 225, and the sixth series switch 226 is disposed so as to allow a signal to flow in a direction parallel to the Y-axis. The third series switch 223 and the fourth series switch 224 are arranged along the Y-axis between the first terminal 211 and the third terminal 213. The fifth series switch 225 and the sixth series switch 226 are arranged along the Y-axis between the second terminal 212 and the fourth terminal 214.

Each of the first to eighth series switches 221 to 228 may be configured by a plurality of MOS-FETs connected in series, as in the first embodiment, but is not limited thereto.

The first electrode 251 is a wiring for connecting the first terminal 211, the first series switch 221, and the third series switch 223. In the present embodiment, the first electrode 251 includes a side portion along the X-axis and a side portion along the Y-axis. The side portion along the Y-axis of the first electrode 251 is joined to the first series switch 221. The side portion along the X-axis of the first electrode 251 is joined to the third series switch 223.

The second electrode 252 is a wiring for connecting the second terminal 212, the second series switch 222, and the sixth series switch 226. In the present embodiment, the second electrode 252 includes a side portion along the X-axis and a side portion along the Y-axis. The side portion along the Y-axis of the second electrode 252 is joined to the second series switch 222. The side portion along the X-axis of the second electrode 252 is joined to the sixth series switch 226.

The third electrode 253 is a wiring for connecting the third terminal 213, the fourth series switch 224, and the eighth series switch 228. In the present embodiment, the third electrode 253 includes a side portion along the X-axis and a side portion along the Y-axis. The side portion along the X-axis of the third electrode 253 is joined to the fourth series switch 224. The side portion along the Y-axis of the third electrode 253 is joined to the eighth series switch 228.

The fourth electrode 254 is a wiring for connecting the fourth terminal 214, the fifth series switch 225, and the seventh series switch 227. In the present embodiment, the fourth electrode 254 includes a side portion along the X-axis and a side portion along the Y-axis. The side portion along the X-axis of the fourth electrode 254 is joined to the fifth series switch 225. The side portion along the Y-axis of the fourth electrode 254 is joined to the seventh series switch 227.

The fifth electrode 255 is a wiring for connecting the first series switch 221, the second series switch 222, and the first shunt switch 131. At least one of the fifth electrode 255 and the first shunt switch 131 is disposed on a line connecting the first terminal 211 and the second terminal 212.

The sixth electrode 256 is a wiring for connecting the third series switch 223, the fourth series switch 224, and the second shunt switch 132. At least one of the sixth electrode 256 and the second shunt switch 132 is disposed on a line connecting the first terminal 211 and the third terminal 213.

The seventh electrode 257 is a wiring for connecting the fifth series switch 225, the sixth series switch 226, and the third shunt switch 133. At least one of the seventh electrode 257 and the third shunt switch 133 is disposed on a line connecting the second terminal 212 and the fourth terminal 214.

The eighth electrode 258 is a wiring for connecting the seventh series switch 227, the eighth series switch 228, and the fourth shunt switch 134. At least one of the eighth electrode 258 and the fourth shunt switch 134 is disposed on a line connecting the third terminal 213 and the fourth terminal 214.

2.2 Effects of Second Embodiment

As described above, the switch circuit 200 according to the present embodiment, in a plan view of the substrate 11, each of the first switch, the second switch, the ninth switch, and the tenth switch is disposed so as to flow a signal in a direction parallel to the first axis, each of the third switch, the fourth switch, the seventh switch, and the eighth switch is disposed so as to flow a signal in a direction parallel to the second axis, the first switch and the second switch are arranged along the first axis between the first terminal and the second terminal, the third switch and the fourth switch are arranged along the second axis between the first terminal and the third terminal, the seventh switch and the eighth switch are arranged along the second axis between the second terminal and the fourth terminal, and the ninth switch and the tenth switch are arranged along the first axis between the third terminal and the fourth terminal.

As described above, even when the elements are arranged in the switch circuit 200, the number of terminals of the switch circuit 200 can be reduced by the common ground terminal 115 similarly to the first embodiment, so that the size of the switch circuit 200 can be reduced. Further, the switch circuit 200 can stabilize the ground potential, and can suppress deterioration in isolation characteristics due to the fluctuation in the ground potential.

According to the switch circuit 200 of the present embodiment, the first to fourth terminals 211 to 214 can be disposed point-symmetrically with respect to the common ground terminal 115 as a symmetrical point. Therefore, it is possible to further improve the symmetry of electrical characteristics between terminals. Further, a linear distance between adjacent terminals can be increased, and the isolation characteristics can be improved.

Third Embodiment

Next, a description will be given of a third embodiment. In the present embodiment, a case where the present disclosure is applied to a single-pole double-throw (SPDT) switch will be described. Hereinafter, the present embodiment will be described specifically with reference to FIG. 8 and FIG. 9, focusing on points different from those of the first and second embodiments described above.

3.1 Circuit Configuration of Switch Circuit 300

Figure 8:
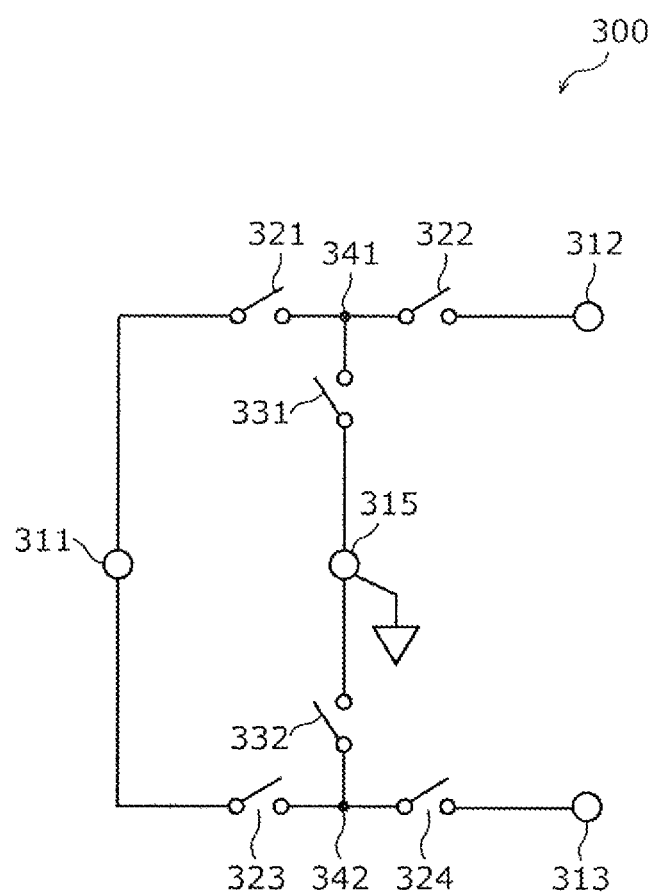
FIG. 8 is a circuit configuration diagram of a switch circuit according to a third embodiment.

First, a circuit configuration of a switch circuit 300 according to the present embodiment will be described specifically with reference to FIG. 8. FIG. 8 is a circuit configuration diagram of the switch circuit 300 according to a third embodiment.

The switch circuit 300 is a so-called SPDT switch, and is mounted on a substrate. The switch circuit 300 includes first to third terminals 311 to 313, a common ground terminal 315, first to fourth series switches 321 to 324, and first and second shunt switches 331 and 332. The switch circuit 300 switches between conduction and non-conduction between the first terminal 311 and the second terminal 312 and between the first terminal 311 and the third terminal 313.

The first series switch 321 and the second series switch 322 are examples of a first switch and a second switch, and are disposed in series on a path connecting the first terminal 311 and the second terminal 312. The first series switch 321 switches between conduction and non-conduction between the first terminal 311 and a first node 341. The second series switch 322 switches between conduction and non-conduction between the second terminal 312 and the first node 341. The first node 341 is a node between the first series switch 321 and the second series switch 322.

The third series switch 323 and the fourth series switch 324 are examples of a third switch and a fourth switch, and are arranged in series on a path connecting the first terminal 311 and the third terminal 313. The third series switch 323 switches between conduction and non-conduction between the first terminal 311 and a second node 342. The fourth series switch 324 switches between conduction and non-conduction between the third terminal 313 and the second node 342. The second node 342 is a node between the third series switch 323 and the fourth series switch 324.

The first shunt switch 331 is an example of a fifth switch, and is connected to the first node 341 and the common ground terminal 315. The first shunt switch 331 switches between conduction and non-conduction between the first node 341 and the common ground terminal 315.

The second shunt switch 332 is an example of a sixth switch, and is connected to the second node 342 and the common ground terminal 315. The second shunt switch 332 switches between conduction and non-conduction between the second node 342 and the common ground terminal 315.

Each of the series switches and shunt switches may be configured by a plurality of MOS-FETs connected in series, as in the first embodiment, but is not limited thereto.

3.2 Arrangement of Circuit Elements in Switch Circuit 300

Figure 9:
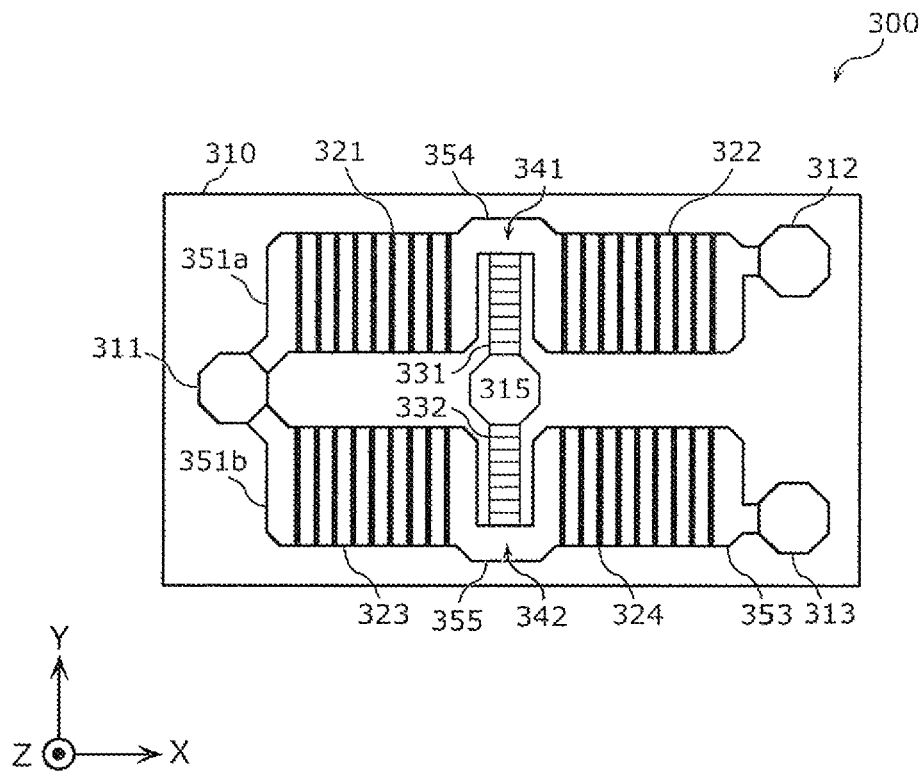
FIG. 9 is a plan view of the switch circuit according to the third embodiment.

Next, the arrangement of the circuit elements configuring the switch circuit 300 will be described specifically with reference to FIG. 9. FIG. 9 is a plan view of the switch circuit 300 according to a third embodiment.

In addition to the circuit elements and terminals illustrated in FIG. 8, the switch circuit 300 further includes a substrate 310 having a substantially rectangular shape in a plan view, and first to fifth electrodes 351a to 355.

The substrate 310 is provided with the first to third terminals 311 to 313, the common ground terminal 315, the first to fourth series switches 321 to 324, the first and second shunt switches 331 and 332, and the first to fifth electrodes 351a to 355. The shape of the substrate 310 is an example, and is not limited to the substantially rectangular shape. In addition, as for the substrate 310, a substrate similar to the substrate 11 in the first embodiment may be used, but particularly is not required to be limited.

The first electrode 351a is a wiring for connecting the first terminal 311 and the first series switch 321. The first electrode 351b is a wiring for connecting the first terminal 311 and the third series switch 323. The second electrode 352 is a wiring for connecting the second terminal 312 and the second series switch 322. The third electrode 353 is a wiring for connecting the third terminal 313 and the fourth series switch 324. The fourth electrode 354 is a wiring for connecting the first series switch 321, the second series switch 322, and the first shunt switch 331. The fifth electrode 355 is a wiring for connecting the third series switch 323, the fourth series switch 324, and the second shunt switch 332.

The shape and arrangement of the circuit elements and the like on the substrate 310 in a plan view will be described below.

The first terminal 311, the second terminal 312, and the third terminal 313 are disposed at positions of three vertices of a substantially triangle shape. More specifically, the first terminal 311 is disposed at a position on the opposite side to a bottom side of a substantially isosceles triangle, and the second terminal 312 and the third terminal 313 are disposed at positions of the other two vertices of the substantially isosceles triangle. Further, the common ground terminal 315 is disposed within the region of the substantially isosceles triangle. Note that this substantially isosceles triangle is a virtual shape represented by virtually connecting three terminals in a straight line, and is not a shape of an actual structure on the substrate 310.

Each of the first to fourth series switches 321 to 324 is disposed so as to allow a signal to flow in a direction parallel to the X-axis. The first to fourth series switches 321 to 324 have the same size and the same shape. Specifically, each of the first to fourth series switches 321 to 324 has a substantially rectangular shape having a long side parallel to the X-axis.

The first to fourth series switches 321 to 324 are arranged in a matrix form at distances. In FIG. 9, the first to fourth series switches 321 to 324 are arranged in two rows and two columns. Specifically, the first series switch 321 and the second series switch 322 are arranged along the X-axis. The third series switch 323 and the fourth series switch 324 are arranged along the X-axis. The first series switch 321 and the third series switch 323 are arranged along the Y-axis. The second series switch 322 and the fourth series switch 324 are arranged along the Y-axis.

The first shunt switch 331 and the second shunt switch 332 have a substantially rectangular shape having a long side parallel to the Y-axis. The first shunt switch 331 and the second shunt switch 332 have the same size and the same shape.

The first shunt switch 331 is disposed in a region between the first series switch 321 and the second series switch 322. Specifically, the first shunt switch 331 extends in the positive direction of the Y-axis from the common ground terminal 315 in the region between the first series switch 321 and the second series switch 322.

The second shunt switch 332 is disposed in a region between the third series switch 323 and the fourth series switch 324. Specifically, the second shunt switch 332 extends in the negative direction of the Y-axis from the common ground terminal 315 in the region between the third series switch 323 and the fourth series switch 324. That is, the first shunt switch 331 and the second shunt switch 332 extend in opposite directions each other from the common ground terminal 315.

Such four series switches and two shunt switches are disposed line-symmetrically with respect to a straight line parallel to the X-axis passing through the common ground terminal 315 as an axis of symmetry. Specifically, the first series switch 321 and the third series switch 323 are disposed line-symmetrically, and the second series switch 322 and the fourth series switch 324 are disposed line-symmetrically. Also, the first shunt switch 331 and the second shunt switch 332 are disposed line-symmetrically.

Each of the first electrode 351a and the first electrode 351b has a side portion extending along the Y-axis. The first electrode 351a is joined to the side portion parallel to the Y-axis of the first series switch 321 at the side portion. The first electrode 351b is joined to the side portion parallel to the Y-axis of the third series switch 323 at the side portion.

Each of the second electrode 352 and the third electrode 353 also includes a side portion extending along the Y-axis. The second electrode 352 is joined to the side portion parallel to the Y-axis of the second series switch 322 at the side portion. The third electrode 353 is joined to the side portion parallel to the Y-axis of the fourth series switch 324 at the side portion.

The fourth electrode 354 is disposed in a region between the first series switch 321 and the second series switch 322, and has a substantially U-like shape that opens toward the common ground terminal 315. The fourth electrode 354 is joined to the side portion of the first series switch 321 and the side portion of the second series switch 322 at outer edges of two arms of the substantially U-like shape. Further the fourth electrode 354 is joined to a distal end portion of the first shunt switch 331 at an inner edge of a substantially U-shaped bottom portion corresponding to the first node 341.

The fifth electrode 355 is disposed in a region between the third series switch 323 and the fourth series switch 324, and has a substantially U-like shape that opens toward the common ground terminal 315. The fifth electrode 355 is joined to the side portion of the third series switch 323 and the side portion of the fourth series switch 324 at outer edges of two arms of the substantially U-like shape. The fifth electrode 355 is joined to a distal end portion of the second shunt switch 332 at an inner edge of a substantially U-shaped bottom portion corresponding to the second node 342.

3.3 Effects of Third Embodiment

As described above, the switch circuit 300 according to the present embodiment is the switch circuit 300 mounted on the substrate 310, and may include the first terminal 311, the second terminal 312, the third terminal 313, and the common ground terminal 315, the first series switch 321 and the second series switch 322 disposed in series on a path connecting the first terminal 311 and the second terminal 312, the third series switch 323 and the fourth series switch 324 disposed in series on a path connecting the first terminal 311 and the third terminal 313, the first shunt switch 331 connected to the common ground terminal 315 and the first node 341 between the first series switch 321 and the second series switch 322, and the second shunt switch 332 connected to the common ground terminal 315 and the second node 342 between the third series switch 323 and the fourth series switch 324.

Thus, the first and second shunt switches 331 and 332 are connected to one common ground terminals 315. Therefore, the number of terminals of the switch circuit 300 can be reduced, and reduction in the size of the switch circuit 300 can be achieved. Furthermore, each shunt switch is connected to the node between two series switches. Accordingly, it is possible to prevent a large current from flowing to the shunt switch without necessarily passing through the series switch, regardless of the direction of a signal flowing between the terminals. For example, even when a signal is input from either of the first terminal 311 and the second terminal 312, by turning off the first series switch 321 and the second series switch 322, current is interrupted or attenuated in either one of the first series switch 321 and the second series switch 322, so that it is possible to prevent a large current from flowing to the first shunt switch 331. As a result, the switch circuit 300 can stabilize the ground potential, and can suppress deterioration in isolation characteristics due to the fluctuation in the ground potential.

According to the switch circuit 300 of the present embodiment, in a plan view of the substrate 310, the first shunt switch 331 may be disposed in a region between the first series switch 321 and the second series switch 322, and the second shunt switch 332 may be disposed in a region between the third series switch 323 and the fourth series switch 324.

Thus, the shunt switch connected to the common ground terminal 315 can be disposed in the region between the two series switches disposed in series on the path connecting the two terminals. In the region between two series switches, a gap is often provided for isolation. Therefore, by disposing the shunt switch in the region between the two series switches, the gap can be effectively utilized, and the switch circuit 300 can be made smaller.

Other Embodiments

Although the switch circuit according to the present disclosure has been described with reference to the embodiments and modification thereof, the switch circuit according to the present disclosure is not limited to the above embodiments and modification thereof. Other embodiments that can be realized by combining any of the above described embodiments and modification thereof, variations which can be obtained by applying various changes conceived by a person skilled in the art on the above embodiments and modification thereof without necessarily departing from the gist of the present disclosure, and various devices incorporating the above-described switch circuit are also included in the present disclosure.

For example, in the switch circuit according to each of the embodiments and modifications thereof, another circuit element and wiring may be inserted between the circuit elements and the paths connecting the signal paths disclosed in the drawings.

In the first embodiment and the modification thereof, the first to fourth terminals 111 to 114 and the first to fourth electrodes 151 to 154 connected to them are not disposed point-symmetrically with respect to the common ground terminal 115 as a symmetrical point, but the present disclosure is not limited thereto. That is, the switch circuits 100 and 100A may be configured to be point-symmetrical with respect to the common ground terminal 115 as a symmetrical point. Thus, the symmetry of the electrical characteristics between the four terminals can be further improved.

Further, the switch circuits according to the above embodiments and modification thereof may be incorporated in a high-frequency module of a communication apparatus. A communication apparatus 5 including the switch circuit 100 and the control circuit 170 according to the first embodiment will be described specifically with reference to FIG. 10.

Figure 10:
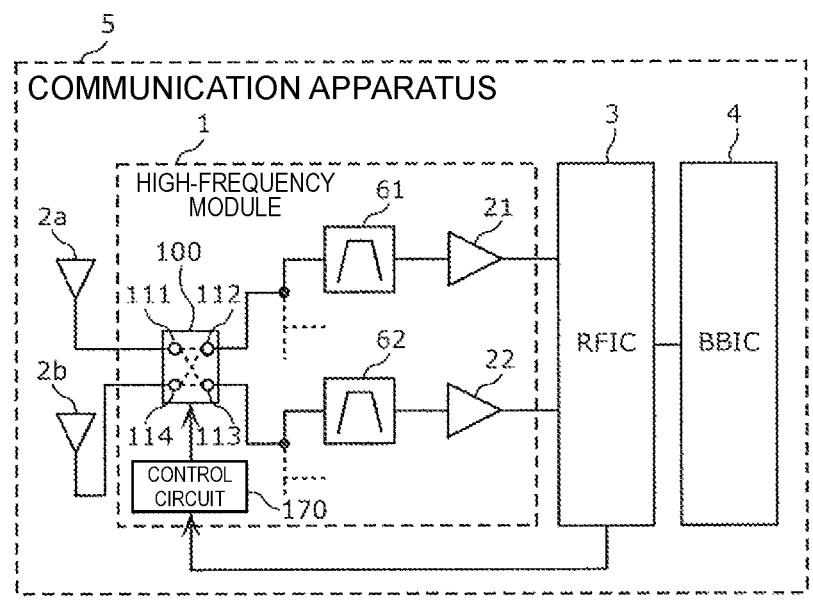
FIG. 10 is a circuit configuration diagram of a communication apparatus according to another embodiment.

FIG. 10 is a circuit configuration diagram of the communication apparatus 5 according to another embodiment. The communication apparatus 5 includes a high-frequency module 1, antenna elements 2a and 2b, an RF signal processing circuit (RFIC) 3, and a baseband signal processing circuit (BBIC) 4.

The high-frequency module 1 transmits a high-frequency signal between the antenna elements 2a and 2b, and the RFIC 3. The high-frequency module 1 is an integrated module integrating various functional components used in a radio front end circuit such as LTE (Long Term Evolution), Wi-Fi (registered trademark), Bluetooth (registered trademark), and GPS (Global Positioning System), for example. Note that the high-frequency module according to the present disclosure is not limited thereto.

The antenna elements 2a and 2b receive the high-frequency signal from the outside and output the high-frequency signal to the high-frequency module 1. The antenna elements 2a and 2b may be used, for example, as diversity antennas, but are not limited thereto.

The RFIC 3 is an RF signal processing circuit for processing high-frequency signals transmitted and received by the antenna elements 2a and 2b. Specifically, the RFIC 3 performs signal processing on the high-frequency signal transmitted and inputted by the high-frequency module 1 by down-conversion or the like, and outputs the received signal generated by the signal processing to a BBIC 4.

The BBIC 4 is a circuit that performs signal processing by using an intermediate frequency band having a lower frequency than that of the high-frequency signal propagating through the high-frequency module 1. The signal processed by the BBIC 4 is used, for example, as an image signal for image display, or as a voice signal for communication via a speaker.

The antenna elements 2a and 2b and the BBIC 4 can be included as components for the communication apparatus according to the present disclosure.

Here, a detailed configuration of the high-frequency module 1 will be described. In this embodiment, the high-frequency module 1 configured a receiving circuit for the high-frequency signal.

As illustrated in FIG. 10, the high-frequency module 1 includes reception low-noise amplifiers 21 and 22, reception filters 61 and 62, the switch circuit 100, and the control circuit 170.

Each of the reception low-noise amplifiers 21 and 22 is an example of an amplifier circuit, and amplifies the high-frequency signal input from the antenna element 2a or 2b via the reception filter 61 or 62 with low noise. The amplified high-frequency signal is output to the RFIC 3.

The reception filter 61 is an example of a high-frequency filter, and is disposed in a path connecting the reception low-noise amplifier 21 and the second terminal 112 of the switch circuit 100. The reception filter 61 passes the high-frequency signal of a reception band of a first communication band among the high-frequency signals input from the antenna element 2a or 2b.

The reception filter 62 is an example of a high-frequency filter, and is disposed in a path connecting the reception low-noise amplifier 22 and the third terminal 113 of the switch circuit 100. The reception filter 62 passes the high-frequency signal of a reception band of a second communication band different from the first communication band among the high-frequency signals input from the antenna element 2a or 2b.

The reception filters 61 and 62 may be any of a surface acoustic wave filter, an acoustic wave filter using a bulk acoustic wave (BAW), a piezoelectric thin film resonator (FBAR: Film Bulk Acoustic Resonator) filter, an LC resonance filter, and a dielectric filter, and are not limited thereto.

The switch circuit 100 is disposed in a path connecting the antenna element 2a and 2b and the reception filters 61 and 62, and switches between conduction and non-conduction between each of the antenna elements 2a and 2b and each of the reception filters 61 and 62. More specifically, the switch circuit 100 switches between (1) the connection between the antenna element 2a and the reception filter 61, (2) the connection between the antenna element 2b and the reception filter 62, (3) the connection between the antenna element 2a and the reception filter 62, and (4) the connection between the antenna element 2b and the reception filter 61. The switch circuit 100 can simultaneously perform the connection of (1) and (2) or the connection of (3) and (4) among the above (1) to (4). The switch circuit 100 may perform only one connection among the above (1) to (4).

The control circuit 170 controls the switch circuit 100.

It should be noted that the reception low-noise amplifiers 21 and 22 and the control circuit 170 can be included as components for the high-frequency module according to the present disclosure.

Note that in the high-frequency module 1 and the communication apparatus 5, another circuit element and wiring may be inserted between the circuit elements and the paths connecting the signal paths disclosed in the drawings. For example, in FIG. 10, a matching circuit for matching impedance between a reception low-noise amplifier and a reception filter may be inserted between the reception low-noise amplifier and the reception filter.

In FIG. 10, the high-frequency module 1 includes the switch circuit 100 according to the first embodiment, but instead of the switch circuit 100, the switch circuit 100A according to the modification of the first embodiment or the switch circuit 200 according to the second embodiment may be provided. Further, when the number of antenna elements is one, the high-frequency module 1 may include the switch circuit 300 according to the third embodiment instead of the switch circuit 100.

The use of the switch circuit according to each of the above-described embodiments is not limited to the switching of the antennas of the high-frequency module. For example, the switch circuit according to the above-described embodiments may be used as a switch for switching between conduction and non-conduction between a plurality of reception filters and one or more reception low-noise amplifiers. Further, the switch circuits according to the above described embodiments may be used for other devices.

In FIG. 10, the reception circuit is described as an example of the high-frequency module including the switch circuit 100, but the high-frequency module may be a transmission circuit. That is, the high-frequency module may include a transmission filter and a transmission power amplifier instead of the reception filter and the reception low-noise amplifier. In this case, the input and output of the filter, amplifier, and the like are reversed. For example, an output signal of a transmission power amplifier is input to a transmission filter. Further, the high-frequency module may be a transmission/reception circuit.

INDUSTRIAL APPLICABILITY

The present disclosure is widely applicable to a communication device such as a mobile phone as a switch circuit used in a high-frequency module.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A switch circuit comprising:
   a first terminal, a second terminal, a third terminal, and a common ground terminal;
   a first switch and a second switch in series in a first path, the first path connecting the first terminal and the second terminal;
   a third switch and a fourth switch in series in a second path, the second path connecting the first terminal and the third terminal;
   a fifth switch connected to the common ground terminal and to a first node, the first node being between the first switch and the second switch; and
   a sixth switch connected to the common ground terminal and to a second node, the second node being between the third switch and the fourth switch, wherein:
   the switch circuit is on a substrate, and
   as seen in a plan view of the substrate:
     the fifth switch is physically arranged in a region between the first switch and the second switch, and
     the sixth switch is physically arranged in a region between the third switch and the fourth switch.

2. The switch circuit according to claim 1, further comprising:
   a fourth terminal;
   a seventh switch and an eighth switch in series in a third path, the third path connecting the fourth terminal and the second terminal;
   a ninth switch and a tenth switch in series in a fourth path, the fourth path connecting the fourth terminal and the third terminal;
   an eleventh switch connected to the common ground terminal and to a third node, the third node being between the seventh switch and the eighth switch; and
   a twelfth switch connected to the common ground terminal and to a fourth node, the fourth node being between the ninth switch and the tenth switch.

3. The switch circuit according to claim 2, wherein as seen in the plan view of the substrate:
   the eleventh switch is physically arranged in a region between the seventh switch and the eighth switch, and
   the twelfth switch is physically arranged in a region between the ninth switch and the tenth switch.

4. The switch circuit according to claim 3, wherein as seen in the plan view of the substrate:
   the fifth switch is physically arranged between the third switch and the eighth switch,
   the sixth switch is physically arranged between the first switch and the tenth switch,
   the eleventh switch is physically arranged between the second switch and the ninth switch, and
   the twelfth switch is physically arranged between the fourth switch and the seventh switch.

5. The switch circuit according to claim 4, wherein as seen in the plan view of the substrate:
   the first terminal, the second terminal, the third terminal, and the fourth terminal are each physically arranged at a different one of four vertices of a substantially rectangular region,
   the common ground terminal is physically arranged within the substantially rectangular region,
   the fifth switch and the twelfth switch extend from the common ground terminal in opposite directions along a second axis, the sixth switch and the eleventh switch extend from the common ground terminal in opposite directions along a first axis, the first axis being perpendicular to the second axis.

6. The switch circuit according to claim 5, wherein as seen in the plan view of the substrate:
each of the first, second, third, fourth, seventh, eighth, ninth, and tenth switches are physically arranged so as to allow a signal to flow in a direction parallel to the second axis,
the first switch, the third switch, the fourth switch, and the tenth switch are physically arranged in a row with each other along the second axis, and
the second switch, the seventh switch, the eighth switch, and the ninth switch are physically arranged in a row with each other along the second axis.

7. The switch circuit according to claim 6, further comprising:
a first electrode connecting the first terminal to the first switch and to the third switch;
a second electrode connecting the second terminal to the second switch and to the eighth switch;
a third electrode connecting the third terminal to the fourth switch and to the tenth switch; and
a fourth electrode connecting the fourth terminal to the seventh switch and to the ninth switch,
wherein as seen in the plan view of the substrate:
each of the first, second, third, fourth, seventh, eighth, ninth, and tenth switches extends along the first axis,
the first electrode extends along the first axis and is physically arranged in a region between the first switch and the third switch,
the second electrode extends along the first axis and is physically arranged in a region between the second switch and the eighth switch,
the third electrode extends along the first axis and is physically arranged in a region between the fourth switch and the tenth switch, and
the fourth electrode extends along the first axis and is physically arranged in a region between the seventh switch and the ninth switch.

8. The switch circuit according to claim 7, further comprising:
a fifth electrode connecting the first switch, the second switch, and the fifth switch;
a sixth electrode connecting the third switch, the fourth switch, and the sixth switch;
a seventh electrode connecting the seventh switch, the eighth switch, and the eleventh switch; and
an eighth electrode connecting the ninth switch, the tenth switch, and the twelfth switch,
wherein as seen in the plan view of the substrate:
the fifth switch or the fifth electrode is physically arranged on a line connecting the first terminal and the second terminal,
the sixth switch or the sixth electrode is physically arranged on a line connecting the first terminal and the third terminal,
the eleventh switch or the seventh electrode is physically arranged on a line connecting the second terminal and the fourth terminal, and
the twelfth switch or the eighth electrode is physically arranged on a line connecting the third terminal and the fourth terminal.

9. The switch circuit according to claim 5, wherein as seen in the plan view of the substrate,
each of the first switch, the second switch, the ninth switch, and the tenth switch is physically arranged so as to allow a signal to flow in a direction parallel to the first axis,
each of the third switch, the fourth switch, the seventh switch, and the eighth switch is physically arranged so as to allow a signal to flow in a direction parallel to the second axis,
the first switch and the second switch are physically arranged along the first axis between the first terminal and the second terminal,
the third switch and the fourth switch are physically arranged along the second axis between the first terminal and the third terminal,
the seventh switch and the eighth switch are physically arranged along the second axis between the second terminal and the fourth terminal,
the ninth switch and the tenth switch are physically arranged along the first axis between the third terminal and the fourth terminal.

10. A high-frequency module comprising:
a plurality of high-frequency filters; and
the switch circuit according to claim 1,
wherein the switch circuit is configured to selectively connect one or more antennas to one or more of the plurality of high-frequency filters.

11. A communication apparatus comprising:
the high-frequency module according to claim 10; and
a radio frequency (RF) signal processing circuit configured to process a high-frequency signal transmitted and received by the one or more antennas,
wherein the high-frequency module is configured to transmit the high-frequency signal between the one or more antennas and the RF signal processing circuit.

* * * * *